United States Patent
Hoessbacher et al.

(10) Patent No.: US 12,189,262 B2
(45) Date of Patent: Jan. 7, 2025

(54) INTEGRATED PLASMONIC MODULATOR

(71) Applicants: Mellanox Technologies, Ltd., Yokneam (IL); ETH ZURICH, Zurich (CH); ARISTOTLE UNIVERSITY OF THESSALONIKI, Salonika (GR)

(72) Inventors: Claudia Hoessbacher, Zurich (CH); Juerg Leuthold, Neerach (CH); Elad Mentovich, Tel Aviv (IL); Paraskevas Bakopoulos, Ilion (GR); Dimitrios Kalavrouziotis, Papagou (GR); Dimitrios Tsiokos, Athens (GR)

(73) Assignees: MELLANOX TECHNOLOGIES, LTD., Yokneam (IL); ETH ZURICH, Zurich (CH); ARISTOTLE UNIVERSITY OF THESSALONIKI, Salonika (GR)

(*) Notice: Subject to any disclaimer, the term of this patent is extended or adjusted under 35 U.S.C. 154(b) by 242 days.

(21) Appl. No.: 17/617,603

(22) PCT Filed: Jun. 10, 2019

(86) PCT No.: PCT/GR2019/000039
§ 371 (c)(1),
(2) Date: Dec. 9, 2021

(87) PCT Pub. No.: WO2020/249984
PCT Pub. Date: Dec. 17, 2020

(65) Prior Publication Data
US 2022/0236619 A1    Jul. 28, 2022

(51) Int. Cl.
*G02F 1/225*      (2006.01)
*G02F 1/21*       (2006.01)
*H01L 21/768*     (2006.01)

(52) U.S. Cl.
CPC .............. *G02F 1/225* (2013.01); *G02F 1/212* (2021.01); *G02F 2203/10* (2013.01); *H01L 21/768* (2013.01)

(58) Field of Classification Search
CPC ......... H01L 21/76802; H01L 21/76804; H01L 21/76805; G02F 1/025; G02F 1/212; G02F 1/225; G02F 2203/10
See application file for complete search history.

(56) References Cited

U.S. PATENT DOCUMENTS 6,522,793 B1    2/2003   Szilagyi et al.
7,627,018 B1   12/2009   Guilfoyle et al.
(Continued)

FOREIGN PATENT DOCUMENTS

DE    102009036033 A1    2/2011
EP        2696229 A      2/2014
(Continued)

OTHER PUBLICATIONS

Haffner et al., "All-plasmonic Mach-Zehnder modulator enabling optical high-speed communication at the microscale", Nature Photonics, vol. 9, pp. 1-5, Jul. 27, 2015 (Year: 2015).*
(Continued)

*Primary Examiner* — Omar R Rojas
(74) *Attorney, Agent, or Firm* — MEITAR PATENTS LTD.

(57) ABSTRACT

An optoelectronic device (20) includes thin film structures (56) disposed on a semiconductor substrate (54) and patterned to define components of an integrated drive circuit, which is configured to generate a drive signal. A back end of line (BEOL) stack (42) of alternating metal layers (44, 46) and dielectric layers (50) is disposed over the thin film structures. The metal layers include a modulator layer (48), which contains a plasmonic waveguide (36, 99, 105) and a
(Continued)

plurality of electrodes (30, 32, 34, 96, 98, 106), which apply a modulation to surface plasmons polaritons (SPPs) propagating in the plasmonic waveguide in response to the drive signal. A plurality of interconnect layers are patterned to connect the thin film structures to the electrodes. An optical input coupler (38, 82) is configured to couple light into the modulator layer, whereby the light is modulated by the modulation of the SPPs, and an optical output coupler (38, 82) is configured to couple the modulated light out of the modulator layer.

14 Claims, 5 Drawing Sheets

(56) References Cited

U.S. PATENT DOCUMENTS

| | | | |
|---|---|---|---|
| 7,811,844 | B2 | 10/2010 | Carothers et al. |
| 8,358,419 | B2 | 1/2013 | Walters |
| 8,378,496 | B2 | 2/2013 | Schrank et al. |
| 8,467,637 | B2 * | 6/2013 | Fujikata .......... H01L 31/022408 257/471 |
| 8,741,684 | B2 | 6/2014 | Bogaerts et al. |
| 8,780,431 | B1 | 7/2014 | Kekatpure et al. |
| 8,837,951 | B2 | 9/2014 | Winston |
| 9,281,661 | B2 | 3/2016 | Su |
| 9,494,715 | B2 * | 11/2016 | Lee .................. G02F 1/011 |
| 9,620,489 | B2 * | 4/2017 | Lipson ............... H01L 25/50 |
| 9,762,025 | B2 | 9/2017 | Johnson et al. |
| 10,396,527 | B2 | 8/2019 | Sirbu et al. |
| 10,488,587 | B2 * | 11/2019 | Chantre ............... H01S 5/026 |
| 2002/0131464 | A1 | 9/2002 | Sirbu et al. |
| 2002/0179929 | A1 | 12/2002 | Takahashi et al. |
| 2010/0278474 | A1 | 11/2010 | Beausoleil et al. |
| 2012/0208174 | A1 | 8/2012 | Galush |
| 2012/0243828 | A1 * | 9/2012 | Suzuki ............. G02B 6/12007 385/32 |
| 2012/0287429 | A1 | 11/2012 | Van Dorpe et al. |
| 2013/0020675 | A1 | 1/2013 | Kireev et al. |
| 2013/0148126 | A1 | 6/2013 | Walters et al. |
| 2013/0172207 | A1 | 7/2013 | Dai et al. |
| 2014/0106469 | A1 | 4/2014 | Wu et al. |
| 2014/0301694 | A1 | 10/2014 | Lee et al. |
| 2014/0348468 | A1 | 11/2014 | Lagziel et al. |
| 2015/0050015 | A1 | 2/2015 | Levy et al. |
| 2017/0033534 | A1 | 2/2017 | Chung et al. |
| 2017/0047708 | A1 | 2/2017 | Johnson |
| 2017/0256915 | A1 | 9/2017 | Ghosh et al. |
| 2017/0365563 | A1 * | 12/2017 | Chen .................. G02F 1/025 |
| 2018/0081204 | A1 | 3/2018 | Ma et al. |
| 2019/0148913 | A1 | 5/2019 | Lebby et al. |
| 2021/0336418 | A1 | 10/2021 | Iakovlev et al. |

FOREIGN PATENT DOCUMENTS

| | | |
|---|---|---|
| WO | 2010083922 A1 | 7/2010 |
| WO | 2011162719 A1 | 12/2011 |
| WO | 2014165836 A1 | 10/2014 |

OTHER PUBLICATIONS

Haffner, C. et al., "Low-loss plasmon-assisted electro-optic modulator", Nature 556, 483-486 (2018), https://doi.org/10.1038/s41586-018-0031-4 (Year: 2018).*
U.S. Appl. No. 16/989,907 Office Action dated Sep. 9, 2022.
U.S. Appl. No. 16/989,907 Office Action dated Mar. 14, 2023.
Burla et al., "500 GHz plasmonic Mach-Zehnder modulator enabling sub-THz microwave photonics," APL Photonics 4, 056106, pp. 1-12, year 2019.
Yang et al., "Integration of an O-band VCSEL on silicon photonics with polarization maintenance and waveguide coupling", Optics Express, vol. 25, No. 5, pp. 5758-5771, Mar. 6, 2017.
Heni et al., "Plasmonic IQ modulators with attojoule per bit electrical energy consumption", Nature Communications, vol. 10, issue 1, p. 10, pp. 1-8, Apr. 12, 2019.
Taillaert et al., "An Out-of-Plane Grating Coupler for Efficient Butt-Coupling Between Compact Planar Waveguides and Single-Mode Fibers", IEEE Journal of Quantum Electronics, vol. 38, No. 7, pp. 949-955, Jul. 2002.
Hoessbacher et al., "Optical Interconnect Solution With Plasmonic Modulator and Ge Photodetector Array," IEEE Photonics Technology Letters, vol. 29, pp. 1760-1763, Nov. 1, 2017.
Hoessbacher et al., "Plasmonic modulator with >170 GHz bandwidth demonstrated at 100 GBd NRZ", Optics Express Journal, vol. 25, No. 3, pp. 1762-1768, Feb. 6, 2017.
Messner et al., "Integrated Ferroelectric Plasmonic Optical Modulator," Optical Society of America, paper TH5C.7, pp. 1-3, year 2017.
Haffner et al., "Low-loss plasmon-assisted electro-optic modulator," Nature, vol. 556, pp. 1-17, year 2018.
Uhl et al., "A 100 Gbit/s 2Vpp Power Multiplexer in SiGe BiCMOS Technology for Directly Driving a Monolithically Integrated Plasmonic MZM in a Silicon Photonics Transmitter," 2017 IEEE Bipolar/BiCMOS Circuits and Technology Meeting (BCTM), pp. 106-109, year 2017.
BABICHEVA et a., "Transparent conducting oxides for electro-optical plasmonic modulators," Nanophotonics, vol. 4, issue 1, pp. 165-185, year 2015.
Haffner et al., "All-plasmonic Mach-Zehnder modulator enabling optical high-speed communication at the microscale", Nature Photonics, vol. 9, pp. 1-5, Jul. 27, 2015.
Larsson et al., "VCSEL modulation speed: status and prospects", Proceedings of SPIE OPTO, vol. 10938, pp. 1-7, Mar. 1, 2019.
Sun et al., "Single-chip microprocessor that communicates directly using light", Nature, vol. 417, pp. 534-538, Dec. 24, 2015.
Fukuda et al., "Plasmonic and electronic device integrated circuits and their characteristics", 45th European Solid State Device Research Conference (ESSDERC), pp. 105-108, Sep. 14, 2015.
Moazeni et al., "A 40-GB/s PAM-4 Transmitter Based on a Ring-Resonator Optical DAC in 45-nm SOI CMOS", IEEE Journal of Solid-State Circuits, vol. 52, issue 12, pp. 3503-3516, Dec. 2017.
Akhter et al., "WaveLight: A Monolithic Low Latency Silicon-Photonics Communication Platform for the Next-Generation Disaggregated Cloud Data Centers", IEEE 25th Annual Symposium on High-Performance Interconnects (HOTI), pp. 25-28, Aug. 28-30, 2017.
International Application # PCT/GR2019/000039 Search Report dated Mar. 9, 2020.
Moeneclaey et al., "A 64 GB/s PAM-4 Linear Optical Receiver," Conference Paper, Optical Fiber Communication Conference, pp. 1-3, year 2015.

* cited by examiner

INTEGRATED PLASMONIC MODULATOR

STATEMENT REGARDING SPONSORED RESEARCH OR DEVELOPMENT

The project leading to this application has received funding from the European Union's Horizon 2020 research and innovation programme under grant agreement No 688166.

FIELD OF THE INVENTION

The present invention relates generally to optical communications, and particularly to devices and methods for high-speed modulation of optical signals.

BACKGROUND

High-speed optical communications require modulation of light sources at very high frequencies. The fastest optical interconnects that have been implemented to date are capable of operating at 100 Gb/s per lane, and higher speeds are in the planning stages.

Plasmonic modulators have been proposed as a possible solution to the need for higher modulation speed. Modulators of this sort are based on the interaction between surface plasmon polaritons (SPPs) and externally applied electric fields. Surface plasmon polaritons are generated at the interface between a dielectric material and a metal, and can be directly excited by light beams. Application of a rapidly-varying electric field to the metal causes a corresponding modulation of the SPPs, which in turn translates into modulation of the light beam at the end of the plasmonic regime. The term "plasmonic modulator" is used in the present description and in the claims to refer to devices that apply an electric field to modulate surface plasmons polaritons, which are then converted back to light beams at the end of the plasmonic regime. The term "light" is used in this context to optical radiation in any of the visible, infrared and ultraviolet ranges.

Plasmonic modulators based on the above principles have been demonstrated experimentally and described in the patent literature, but they are still far from commercial deployment. For example, PCT International Publication WO 2011/162719 describes a metal-oxide-semiconductor plasmonic slot waveguide, which includes a silicon layer, a silicon oxide layer laterally disposed next to a first side wall of the silicon layer, a first metal layer laterally disposed next to the silicon oxide layer, and a second metal layer laterally disposed next to a second side wall of the silicon layer, wherein the second side wall is opposite to the first side wall. A plasmonic mode can propagate along the slot waveguide, and the propagating characteristics can be adjusted by the voltage applied on the metal layers. A metal-oxide-semiconductor plasmonic modulator includes first and second metal-oxide-semiconductor plasmonic slot waveguides of this sort.

Embodiments of the present invention that are described hereinbelow provide improved devices and methods for high-speed modulation of light beams.

There is therefore provided, in accordance with an embodiment of the invention, an optoelectronic device, including a semiconductor substrate and thin film structures disposed on the substrate and patterned to define components of an integrated drive circuit, which is configured to generate a drive signal. A back end of line (BEOL) stack of alternating metal layers and dielectric layers disposed over the thin film structures. The metal layers include a modulator layer, which contains a plasmonic waveguide and is patterned to define a plurality of electrodes, which are configured to apply a modulation to surface plasmons polaritons (SPPs) propagating in the plasmonic waveguide in response to the drive signal applied to the electrodes. A plurality of interconnect layers are patterned to define electrical traces, which are connected by vias to the thin film structures on the substrate and to the electrodes in the modulator layer so as to interconnect the components of the integrated drive circuit and to apply the drive signal generated thereby to the electrodes. An optical input coupler is configured to couple light into the modulator layer, whereby the light is modulated by the modulation of the SPPs. An optical output coupler is configured to couple the modulated light out of the modulator layer.

In one embodiment, the plasmonic waveguide is configured as a Mach-Zender interferometer, having first and second parallel legs, and the electrodes includes at least first and second electrodes, which are configured to apply the modulation to the SPPs with different, respective phases to the first and second parallel legs.

In another embodiment, the electrodes are patterned to define a ring modulator.

In some embodiments, at least one of the optical couplers is disposed in a plane of the modulator layer. Alternatively or additionally, at least one of the optical couplers is formed on the modulator layer and is configured to couple the light between the modulator layer and a propagation direction that is not parallel to a plane of the modulator layer.

In a disclosed embodiment, the modulator layer is a final, outer layer of the BEOL stack.

In some embodiments, the device includes an electro-optical layer disposed over the modulator layer and within the plasmonic waveguide. Additionally or alternatively, a transparent conductive oxide is disposed over the modulator layer and within the plasmonic waveguide.

There is also provided, in accordance with an embodiment of the invention, a method for fabrication of an optoelectronic device. The method includes forming and patterning thin film structures on a semiconductor substrate so as to define components of an integrated drive circuit, which is configured to generate a drive signal. A back end of line (BEOL) stack of alternating metal layers and dielectric layers is deposited and patterned over the thin film structures. The metal layers include a modulator layer, which contains a plasmonic waveguide and is patterned to define a plurality of electrodes, which are configured to apply a modulation to surface plasmon polaritons (SPPs) propagating in the plasmonic waveguide in response to the drive signal applied to the electrodes. A plurality of interconnect layers are patterned to define electrical traces, which are connected by vias to the thin film structures on the substrate and to the electrodes in the modulator layer so as to interconnect the components of the integrated drive circuit and to apply the drive signal generated thereby to the electrodes. Light is coupled into the modulator layer, whereby the light is modulated by the modulation of the SPPs, and the modulated light is coupled out of the modulator layer.

The present invention will be more fully understood from the following detailed description of the embodiments thereof, taken together with the drawings in which:

Figure 1A:
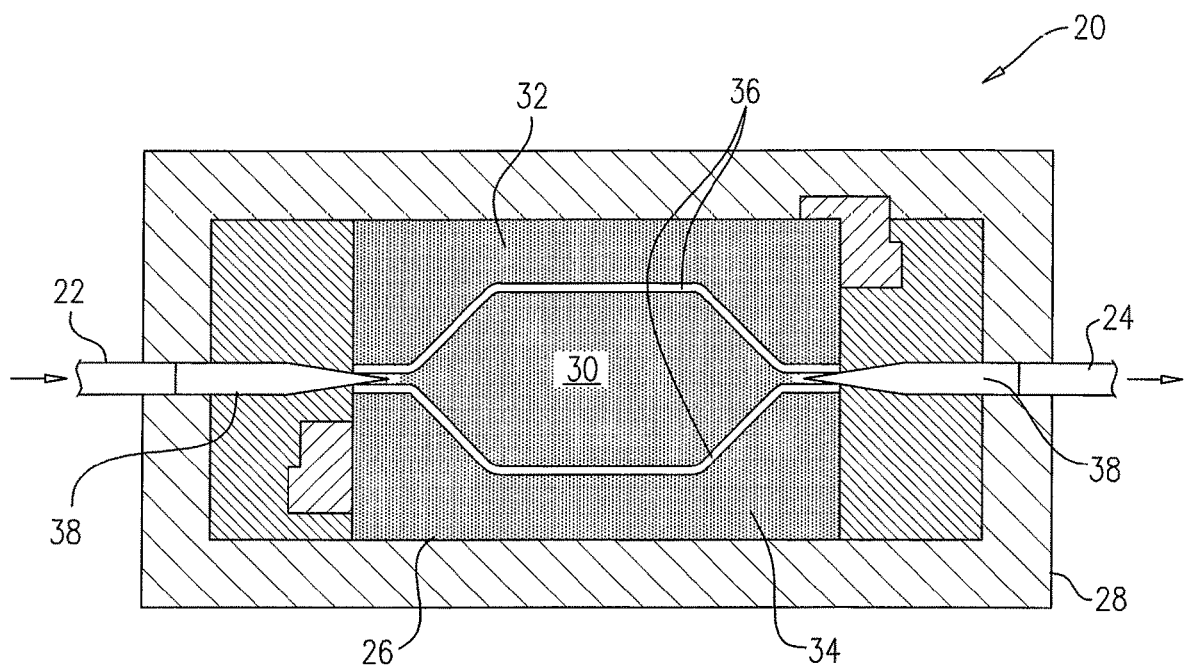
FIG. 1A is a schematic top view of an integrated plasmonic modulation device, in accordance with an embodiment of the invention.

Plasmonic modulators are physically capable of modulating light at rates well in excess of 100 Gb/s. Furthermore, due to the increased light-matter interaction exhibited by surface plasmon polaritons (SPPs), plasmonic devices can apply deep modulation to an incident light beam over very short interaction lengths, while requiring only moderate excitation voltages. To realize these advantages in practical devices, however, it is also necessary to generate and apply the required high-speed electrical drive signals to the plasmonic modulator efficiently, over a link that is as short as possible, while minimizing parasitic capacitance and power loss.

Embodiments of the present invention that are described herein address this need by integrating a plasmonic modulator into the back end of line (BEOL) stack of the same integrated circuit (IC) device that generates the drive signal. As is well known in the art, IC fabrication starts with front end of line (FEOL) steps, in which thin film structures are deposited on a semiconductor substrate, such as a silicon wafer, and are patterned to define the components of the IC, such as transistors, diodes, capacitors and resistors. The BEOL stack is then formed by depositing alternating metal layers and dielectric layers over the thin film structures. The metal layers are patterned to define electrical traces, which are connected by vias to the thin film structures on the substrate so as to interconnect the components of the IC and thus create a functional device.

In the present embodiments, one of the BEOL layers serves as a modulator layer. An optical input coupler couples light into the modulator layer. This layer contains a plasmonic waveguide, with metal patterned to define electrodes in contact with the waveguide. The FEOL and the remaining, interconnect layers of the BEOL stack form a high-speed integrated drive circuit, which generates a drive signal for the modulator. Vias between the interconnect layers and the modulator layer supply this drive signal to the electrodes, which thus modulate the plasmons in the waveguide. This modulation is translated into optical modulation when the plasmons are converted back to light at the output of the plasmonic modulator. An optical output coupler couples the modulated light out of the modulator layer.

This use of a BEOL layer as an optical modulator differs from usual IC fabrication practices, in which the active components of the IC are in the FEOL layers, and the BEOL provides only passive interconnects. BEOL processes, however, are well suited to etching the electrical structures and plasmonic waveguide of the modulator and can be adapted to receive and transmit the light beam that is to be modulated, using optical coupling techniques that are known in the art. The three-dimensional integration of the modulator with its drive circuit in the same IC chip that is provided by the present embodiments achieves high integration density, as well as very short interconnects, with low parasitic capacitance, between the drive circuit and the modulator. Modulators in accordance with the present embodiments are thus capable of ultra-high-speed modulation with high electrical efficiency and low heat dissipation.

Figure 1B:
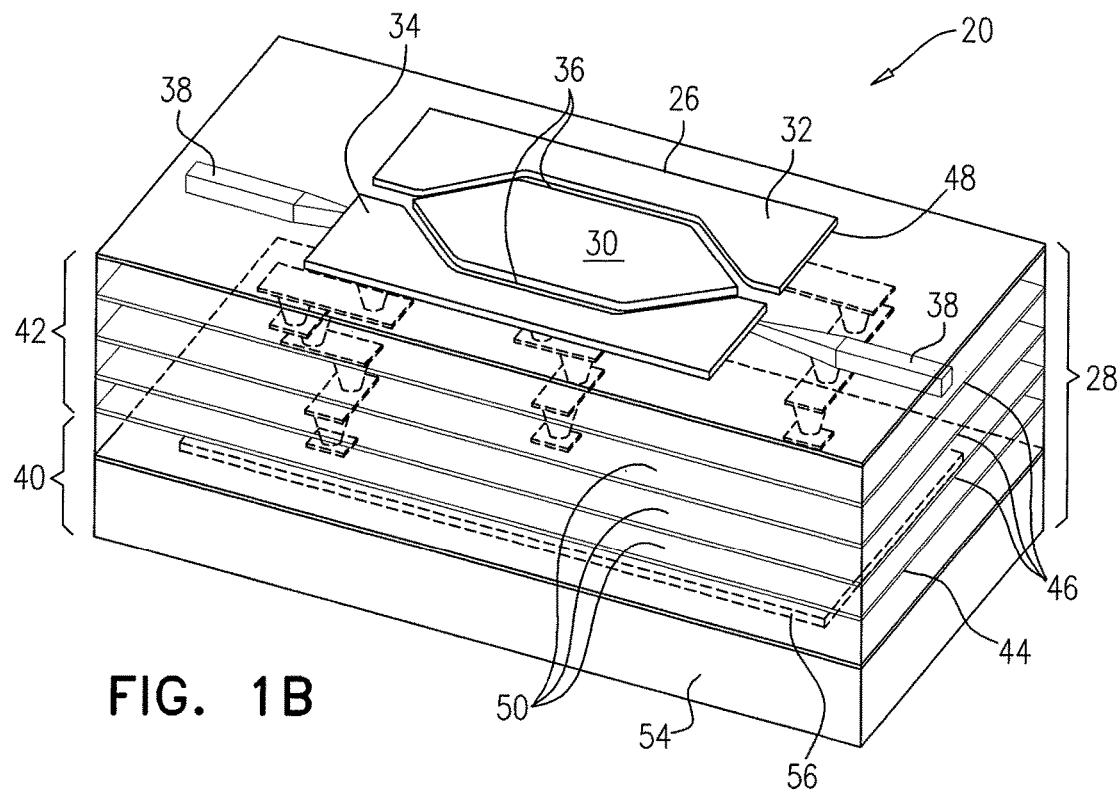
FIG. 1B is a schematic pictorial view showing details of the device of FIG. 1A.
Figure 1C:
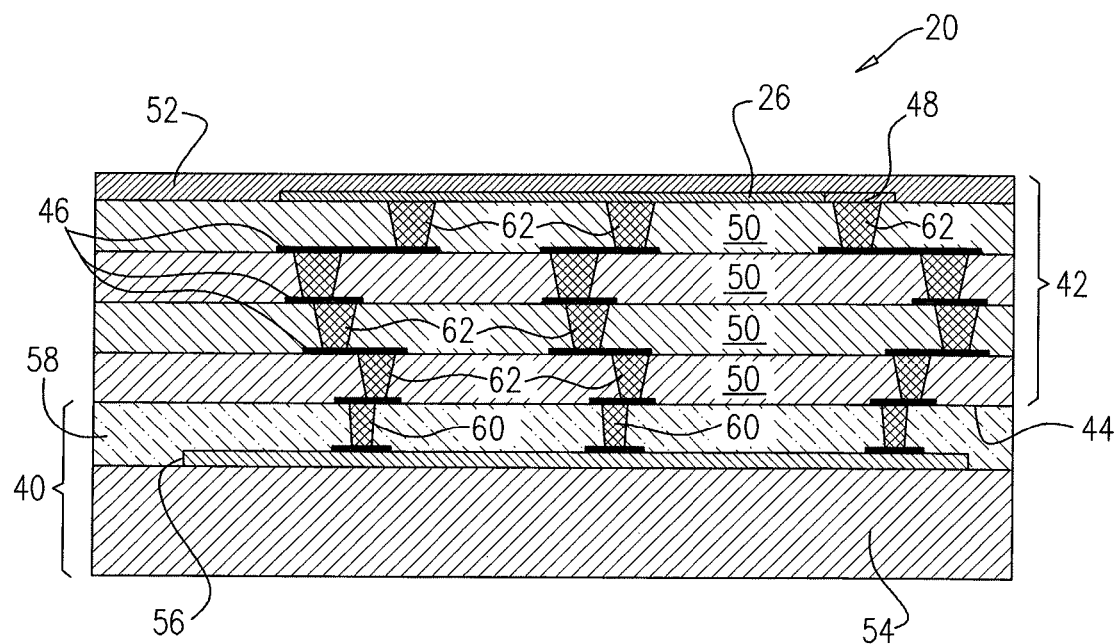
FIG. 1C is a schematic side view of the device of FIG. 1A.

Reference is now made to FIGS. 1A-C, which schematically illustrate an integrated plasmonic modulation device 20, in accordance with an embodiment of the invention. FIG. 1A is a top view, while FIGS. 1B and 1C are pictorial and side views, respectively, showing details of the internal structure of the device. The upper layer of device 20 comprises a plasmonic modulator 26, which receives an input beam of light via an input optical waveguide 22, and outputs a modulated beam to an output optical waveguide 24. Waveguides 22 and 24 may comprise optical fibers, for example. Alternatively, modulator 26 may receive and transmit beams of light through free space.

Modulator 26 in this embodiment has the form of a Mach-Zender interferometer, comprising a slot waveguide 36 for surface plasmon polaritons (SPPs) within a metal modulator layer 48. Waveguide 36 splits into two parallel legs at a Y-junction at one end of modulator 26, which then rejoin at another Y-junction at the other end. The slots of waveguide 36 are defined by a common central electrode 30 and excitation electrodes 32 and 34 on opposing sides of the modulator. In a typical implementation, the slots are about 100-200 nm deep, 75-100 nm wide, and 10-25 μm long; but these dimensions are presented solely by way of example, and larger or smaller dimensions may alternatively be used. Electrode 30 may be grounded, for example, while electrodes 32 and 34 are driven by signals with different respective phases, such as a drive signal S on electrode 32 and its inverse $\tilde{S}$ on electrode 34. The drive signals are typically in the range of a few volts peak-to-peak, but larger or smaller voltages may alternatively be used depending on application requirements. An electro-optical layer 52 is deposited over modulator layer 48, as shown in FIG. 1C, and fills the slots of waveguide 36. Layer 52 may comprise any suitable sort of electro-optical material, for example a monolithic chromophore, such as DLD164, or a suitable ceramic, such as barium titanate (BaTiO3).

Optical couplers 38, parallel to the plane of modulator layer 48, couple the light into and out of modulator 26. In the pictured example, couplers 38 comprise tapered dielectric waveguides, for example SiN waveguides, which are formed by deposition and etching in a dielectric layer 50 below modulator 26. Alternatively, couplers 38 may comprise other suitable optical materials, such as silicon, and may be formed in or over the plane of modulator 26. Couplers 38 in the present example taper adiabatically, so that light propagates into and out of waveguide 36 in a single mode, without substantial reflection or energy transfer into higher order-modes, thus exhibiting low optical loss. Alternatively, other suitable sorts of couplers may be used. Although modulator layer 48 is shown in FIGS. 1A-C as being the top metal layer in device 20, the modulator layer may alternatively be an internal layer within the IC device.

As shown in FIGS. 1B and 1C, device 20 comprise FEOL layers 40, overlaid by a BEOL stack 42, which includes modulator layer 48. FEOL layers 40 typically comprise a semiconductor substrate 54, such as a silicon wafer substrate. Thin film structures 56 are formed on substrate 54 by processes of doping, thin film deposition, and etching, for example, with an overlying dielectric layer 58, comprising $SiO_2$, for example. BEOL stack 42 comprises a lower metal layer 44, followed by alternating dielectric layers 50 and metal interconnect layers 46. Lower metal layer 44 and interconnect layers 46 are patterned to define electrical traces, which are interconnected by vias 62 through dielectric layers 50 and by vias 60 through dielectric layer 58 to thin film structures 56.

The patterned metal layers 44, 46 and vias 60, 62 thus interconnect the components of FEOL layers 40 to create an integrated drive circuit, and may comprise associated logic circuits, as well. Any suitable IC technology that is known in the art may be used for this purpose. For example, the drive circuit may be implemented using standard complementary metal-oxide-semiconductor (CMOS) technology. Alternatively, for higher speed, the drive circuits may be implemented using BiCMOS technology, which combines CMOS transistors with bipolar junction transistors.

In any case, the drive signal generated by this drive circuit is applied between electrodes 30, 32 and 34 through vias 62, which connect modulator layer 48 to the next metal layer 46 down BEOL stack 42. (In an alternative embodiment, not shown in the figures, the modulator layer can be located at an intermediate level, as noted earlier, with interconnecting vias above and below.) Layer 48 may comprise any suitable metal, and not necessarily one of the metals normally used with the IC technology of the drive circuit.

Figure 2:
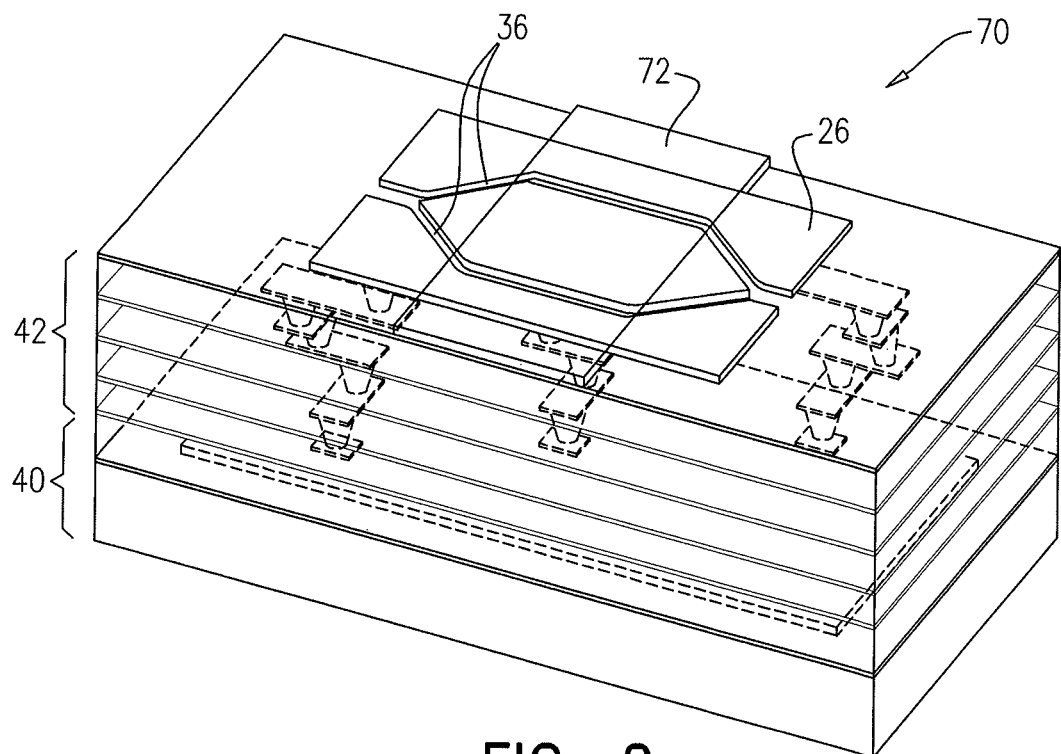
FIG. 2 is a schematic pictorial view of an integrated plasmonic modulation device, in accordance with another embodiment of the invention.

FIG. 2 is a schematic pictorial view of an integrated plasmonic modulation device 70, in accordance with another embodiment of the invention. Device 70 is substantially similar to device 20, as described above, except that in device 70, an electro-optical layer 72 is deposited only over the part of the modulator layer where it is actually required, for example over the parallel legs of waveguide 36. This approach leaves the rest of the upper surface of device open for other features, such as optical couplers (not shown in this figure). Alternatively, the electro-optical material may be deposited only within the slots of the waveguide, particularly when the modulator layer is not the outer layer of the BEOL stack.

Figure 3:
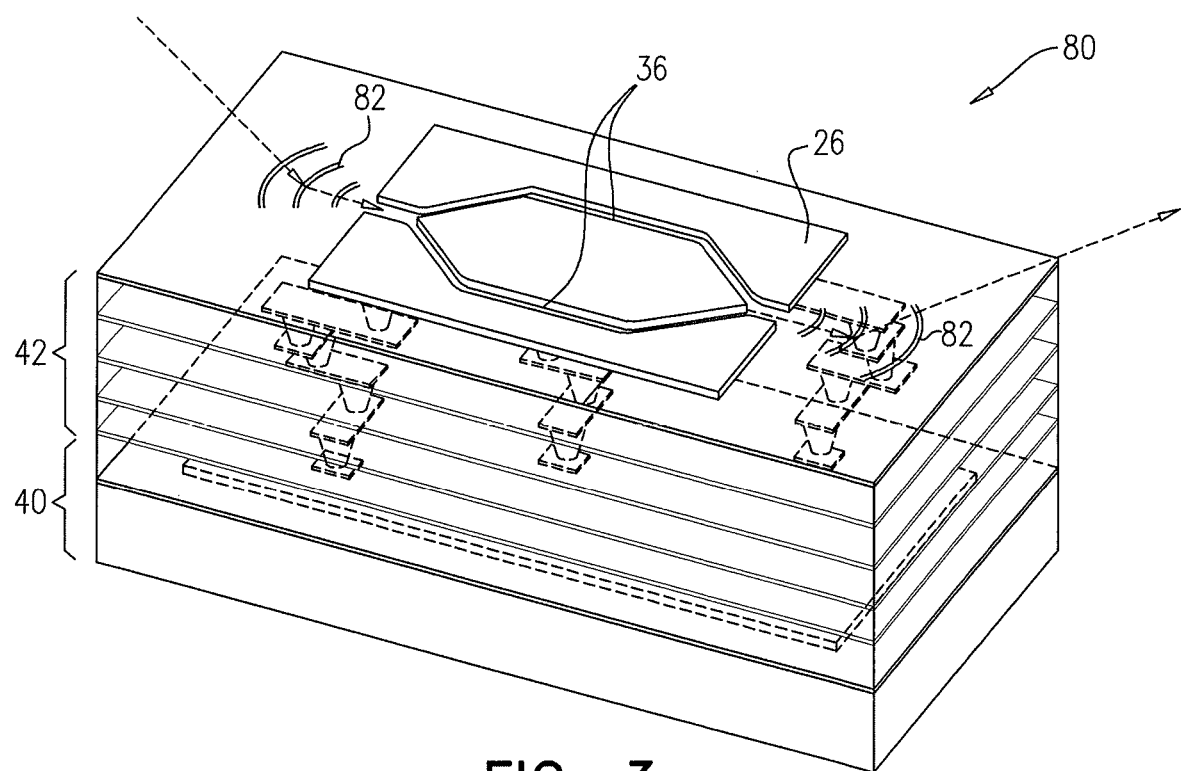
FIG. 3 is a schematic pictorial view of an integrated plasmonic modulation device, in accordance with yet another embodiment of the invention.

FIG. 3 is a schematic pictorial view of an integrated plasmonic modulation device 80, in accordance with yet another embodiment of the invention. Device 80 also resembles device 20, with modulator 26 in the final, outer layer of BEOL stack 42. Instead of the in-plane optical coupling in device 20, however, device 80 comprises out-of-plane optical couplers 82, for example grating couplers, as are known in the art. Couplers 82 are formed on the modulator layer and couple light into and out of waveguide 36 from and to propagation directions that are not parallel to the plane of the modulator layer. The light may be transmitted to and from couplers 82 through free space or through waveguides, such as suitably positioned optical fibers.

Although device 80 is shown in FIG. 3 as comprising both input and output couplers 82 of this sort, in an alternative embodiment, the modulator device may comprise one in-plane coupler and one out-of-plane coupler.

Figure 4:
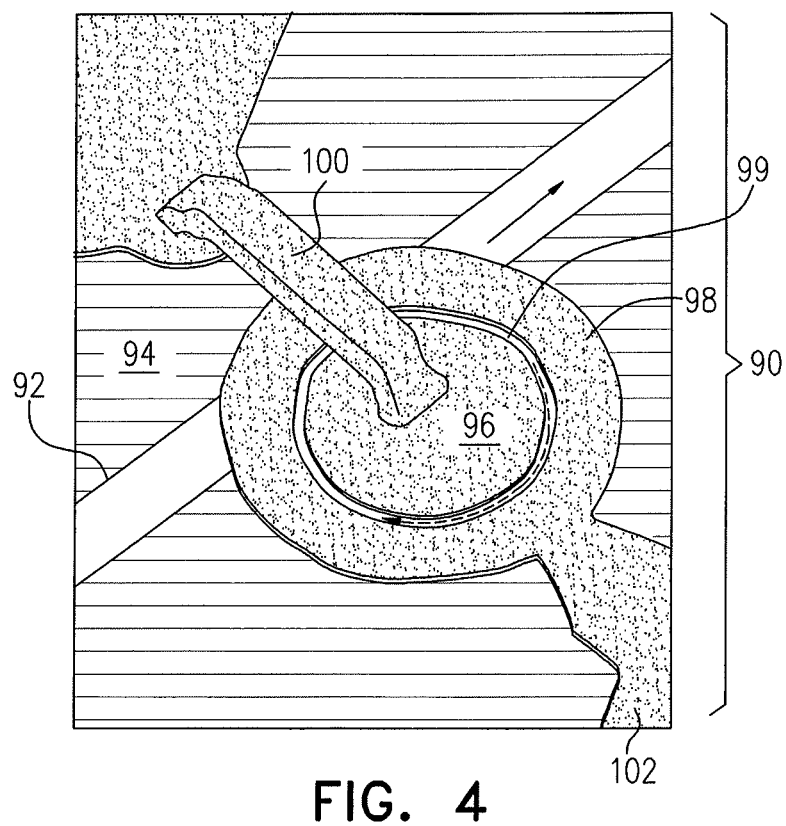
FIG. 4 is a schematic detail view of a plasmonic modulator, in accordance with still another embodiment of the invention.

FIG. 4 is a schematic detail view of a plasmonic ring modulator 90, in accordance with still another embodiment of the invention. Ring modulator 90 may be used in the sorts of plasmonic modulation devices described above in place of Mach-Zender modulator 26, mutatis mutandis. Alternatively, other plasmonic modulator configurations (not shown in the figures) that are suitable for integration in the BEOL stack may be used, as well.

In the example shown in FIG. 4, a dielectric waveguide 92, comprising SiN, for example, is deposited over or formed within a dielectric (typically $SiO_2$) layer 94 in the BEOL stack. Alternatively, other types of waveguides may be used, such as a silicon waveguide. A disk electrode 96 and a surrounding ring electrode 98 are patterned in the overlying metal layer to define the ring modulator, with a circular slot waveguide 99 between the electrodes. The slot is typically about 100-200 nm deep, 75-100 nm wide, and 6 µm in diameter, and is filled with an electro-optical material, as in the preceding embodiment. (These dimensions are again presented solely by way of example, and larger or smaller dimensions may alternatively be used.) Electrical contacts 100 and 102, which are typically formed as part of the BEOL metallization, apply the drive signal between the electrodes, across waveguide 99, thus modulating the light passing through waveguide 92. Although contact 100 is shown in FIG. 4 as a bridge extending above ring electrode 98, this contact may alternatively be made from below disk electrode 96, within the BEOL stack.

Figure 5:
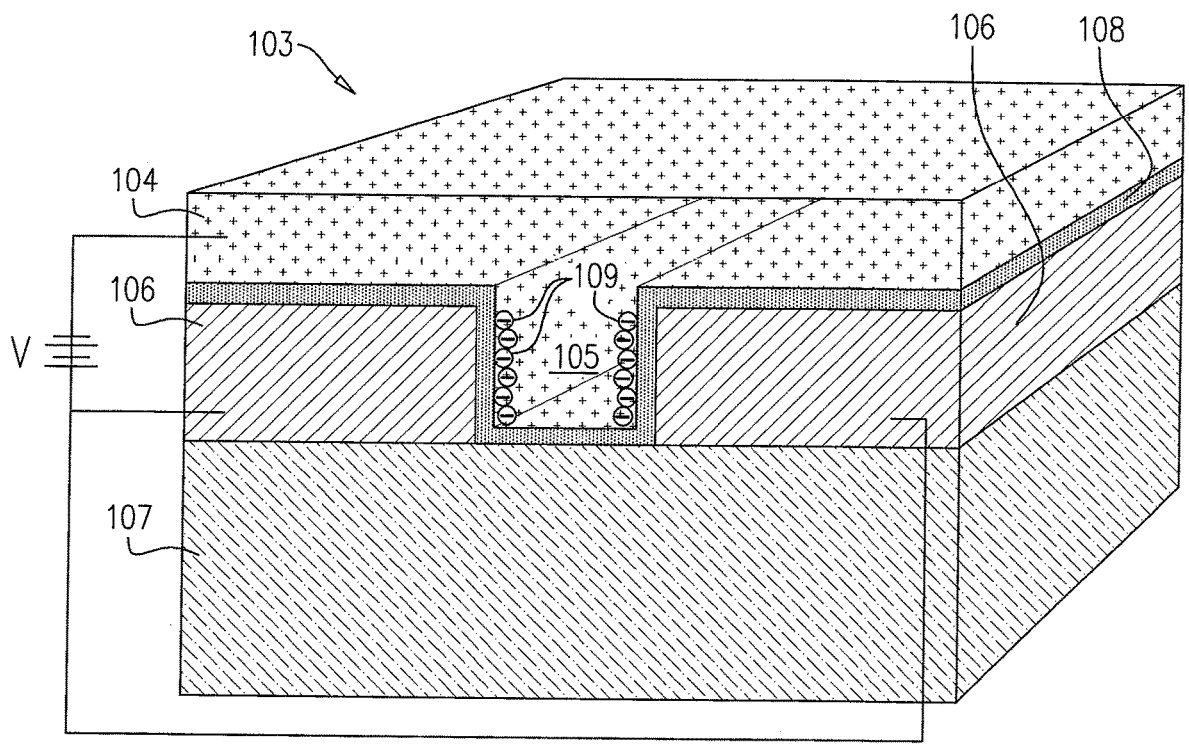
FIG. 5 is a schematic detail view of a plasmonic modulator, in accordance with still another embodiment of the invention.

FIG. 5 is a schematic detail view of a plasmonic slot modulator 103, in accordance with still another embodiment of the invention. Slot modulator 103 may be used in the sorts of plasmonic modulation devices described above in place of Mach-Zender modulator 26, mutatis mutandis.

In the example shown in FIG. 5, a slot 105 is etched through a metal layer of the BEOL stack, thus defining electrodes 106 on one or both sides of the slot. The metal layer may comprise gold, for example, with a thickness (and thus slot depth) of 200 nm, which is deposited over a dielectric layer 107, such as $SiO_2$. The width of the slot is typically in the range of 300 nm, for example. A thin dielectric layer 108, for example $Al_2O_3$, with a thickness of about 5 nm, is deposited over electrodes 106. A transparent conductive oxide (TCO) layer 104, such as indium tin oxide (ITO) is then deposited over and within slot 105.

Application of a voltage V to electrodes 106 causes charges 109 to accumulate in slot 105, thus changing the permittivity and hence the absorption of plasmons in in the TCO within the slot. Modulating the voltage results in a corresponding modulation of the absorption. Modulator 103 is thus capable of high-frequency plasmonic modulation by electro-absorption, without requiring the sort of interferometric structures used in the preceding embodiments.

Figure 6:
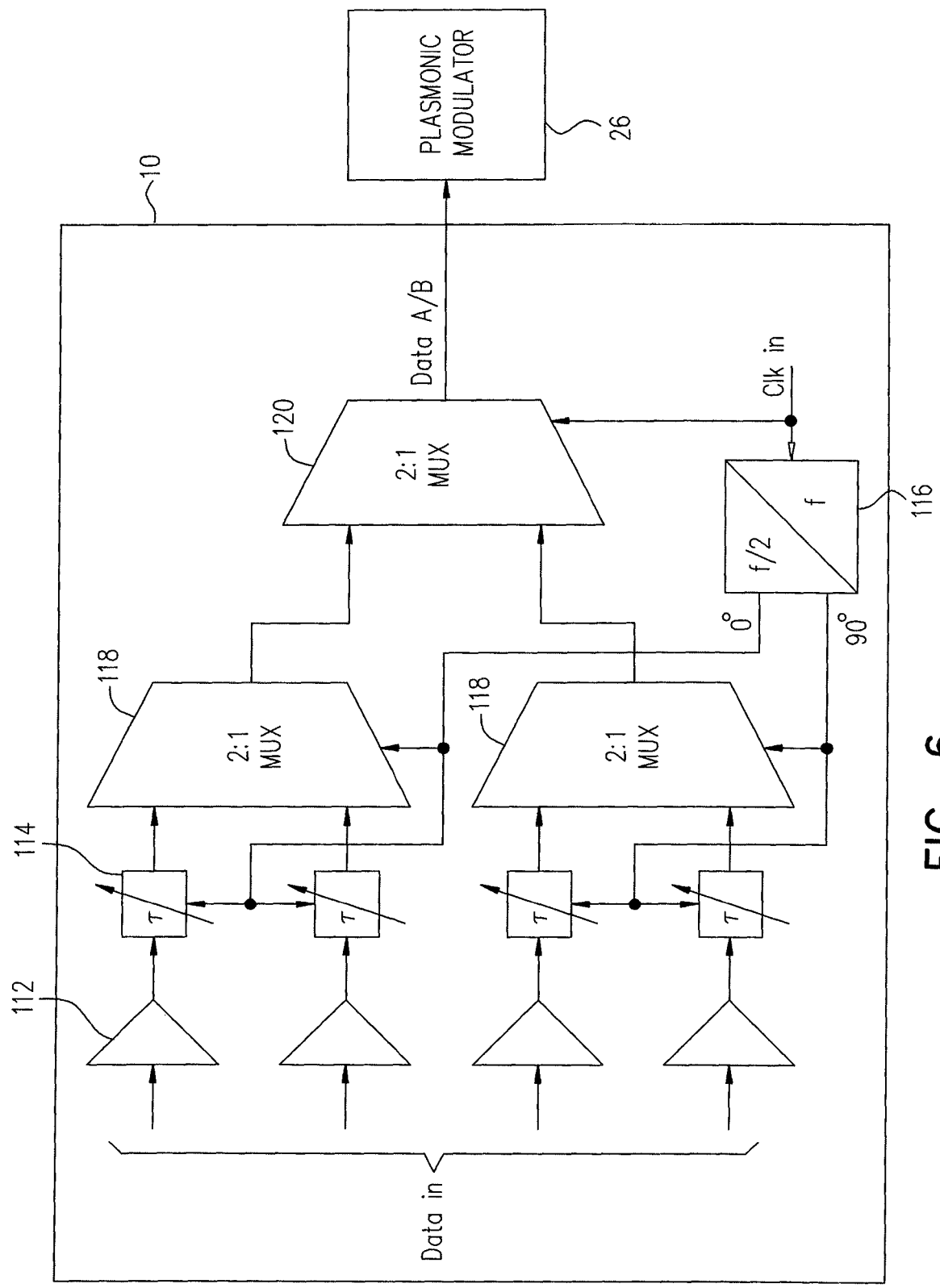
FIG. 6 is an electrical schematic diagram of an integrated drive circuit for use in a plasmonic modulation device, in accordance with an embodiment of the invention.

FIG. 6 is an electrical schematic diagram of an integrated drive circuit 110 for use in a plasmonic modulation device, in accordance with an embodiment of the invention. A drive circuit of this sort can be implemented in FEOL layers 40 of the plasmonic modulation devices described above, with interconnects through BEOL stack 42. Drive circuit 110 is suitable for implementation using BiCMOS technology, in order to reach a drive bandwidth that fully exploits the available modulation bandwidth of plasmonic modulator 26.

Drive circuit 110 uses a power multiplexer (PMUX) approach, in which multiple low-speed tributaries are combined through a number of multiplexing stages to create a high-speed signal. In other words, drive circuit 110 receives several input data signals (four signals in the pictured example) via respective buffer amplifiers 112. A clock divider 116 splits an input clock at the desired drive frequency f into component clocks of frequency f/2 with phases 90° apart. Individual clock dividers 114 split these clock signals again into four input clocks with frequency f/4 and different, respective phases for the four input data channels. Two multiplexers 118 each combine a pair of the input signals, and a multiplexer 120 combines these paired signals to generate the drive signal to modulator 26 at the drive clock rate f, which is four times the input clock rate of each of the four data channels.

Alternatively, a smaller or larger number of data inputs and multiplexing stages can be used to generate drive signals at a smaller or larger multiple of the input clock rate. For example, the outputs of two 4:1 multiplexers with the topology shown in FIG. 6 may be multiplexed together with different, respective phases in order to multiplex eight data channels into a single output.

The final multiplexer 120 directly drives plasmonic modulator 26, without requiring an additional buffer or driver amplifier. The signal modulation format in the embodiment shown in FIG. 6 is non-return-to-zero (NRZ), but alternatively, the drive circuit can be adapted to other modulation schemes, such as four-level pulse amplitude modulation (PAM4).

In alternative embodiments, other sorts of drive circuits can be used to drive plasmonic modulators in accordance with the present embodiments, even if not at the maximal data rate supported by the modulator. For example, plasmonic modulator 26 can be integrated in the BEOL stack of a CMOS IC, such as a CMOS switching circuit. In this case the "drive circuit" of the modulator could simply be the SerDes (serializer/deserializer) at the output of the switching circuit.

In any of the above embodiments, because of the small dimensions of the plasmonic modulator, the modulator is seen by the drive circuits as a small, lumped capacitive load, typically on the order of a few femtofarads. Because the modulator is so closely coupled to the FEOL layers of the IC, there is little or no parasitic capacitive or inductive loss in the circuit, and no need for 50 ohm termination. Thus, the plasmonic modulator can fully exploit the available data rate and driving power of the drive circuit, regardless of the IC technology—whether high-speed BiCMOS as in FIG. 5, CMOS, or any other suitable IC type.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
a semiconductor substrate;
thin film structures disposed on the substrate and patterned to define components of an integrated drive circuit, which is configured to generate a drive signal;
a back end of line (BEOL) stack of alternating metal layers and dielectric layers disposed over the thin film structures, the metal layers comprising:
a modulator layer, which is a final, outer layer of the BEOL stack and comprises gold, and which contains a plasmonic waveguide and is patterned to define a plurality of electrodes, which are configured to apply a modulation to surface plasmons polaritons (SPPs) propagating in the plasmonic waveguide in response to the drive signal applied to the electrodes; and
a plurality of interconnect layers, which are patterned to define electrical traces, which are connected by vias to the thin film structures on the substrate and to the electrodes in the modulator layer so as to interconnect the components of the integrated drive circuit and to apply the drive signal generated thereby to the electrodes;
an optical input coupler, which is configured to couple light into the modulator layer, whereby the light is modulated by the modulation of the SPPs; and
an optical output coupler, which is configured to couple the modulated light out of the modulator layer.

2. The device according to claim 1, wherein the plasmonic waveguide is configured as a Mach-Zender interferometer, having first and second parallel legs, and wherein the electrodes comprises at least first and second electrodes, which are configured to apply the modulation to the SPPs with different, respective phases to the first and second parallel legs.

3. The device according to claim 1, wherein the electrodes are patterned to define a ring modulator.

4. The device according to claim 1, wherein at least one of the optical couplers is disposed in a plane of the modulator layer.

5. The device according to claim 1, wherein at least one of the optical couplers is formed on the modulator layer and is configured to couple the light between the modulator layer and a propagation direction that is not parallel to a plane of the modulator layer.

6. The device according to claim 1, and comprising an electro-optical layer disposed over the modulator layer and within the plasmonic waveguide.

7. The device according to claim 1, and comprising a transparent conductive oxide disposed over the modulator layer and within the plasmonic waveguide.

8. A method for fabrication of an optoelectronic device, comprising:
forming and patterning thin film structures on a semiconductor substrate so as to define components of an integrated drive circuit, which is configured to generate a drive signal;
depositing and patterning a back end of line (BEOL) stack of alternating metal layers and dielectric layers over the thin film structures, the metal layers comprising:
a modulator layer, which is a final, outer layer of the BEOL stack and comprises gold, and which contains a plasmonic waveguide and is patterned to define a plurality of electrodes, which are configured to apply a modulation to surface plasmon polaritons (SPPs) propagating in the plasmonic waveguide in response to the drive signal applied to the electrodes; and
a plurality of interconnect layers, which are patterned to define electrical traces, which are connected by vias to the thin film structures on the substrate and to the electrodes in the modulator layer so as to interconnect the components of the integrated drive circuit and to apply the drive signal generated thereby to the electrodes;
coupling light into the modulator layer, whereby the light is modulated by the modulation of the SPPs; and
coupling the modulated light out of the modulator layer.

9. The method according to claim 8, wherein the plasmonic waveguide is configured as a Mach-Zender interferometer, having first and second parallel legs, and wherein the electrodes comprises at least first and second electrodes, which are configured to apply the modulation to the SPPs with different, respective phases to the first and second parallel legs.

10. The method according to claim 8, wherein the electrodes are patterned to define a ring modulator.

11. The method according to claim 8, wherein coupling the light comprises placing an optical coupler in a plane of the modulator layer for coupling the light into or out of the modulator layer.

12. The method according to claim 8, wherein coupling the light comprises placing an optical coupler on the modulator layer for coupling the light between the modulator layer and a propagation direction that is not parallel to a plane of the modulator layer.

13. The method according to claim 8, and comprising depositing an electro-optical layer over the modulator layer and within the plasmonic waveguide.

14. The method according to claim 8, and comprising depositing transparent conductive oxide over the modulator layer and within the plasmonic waveguide.

\* \* \* \* \*